Figure 1:
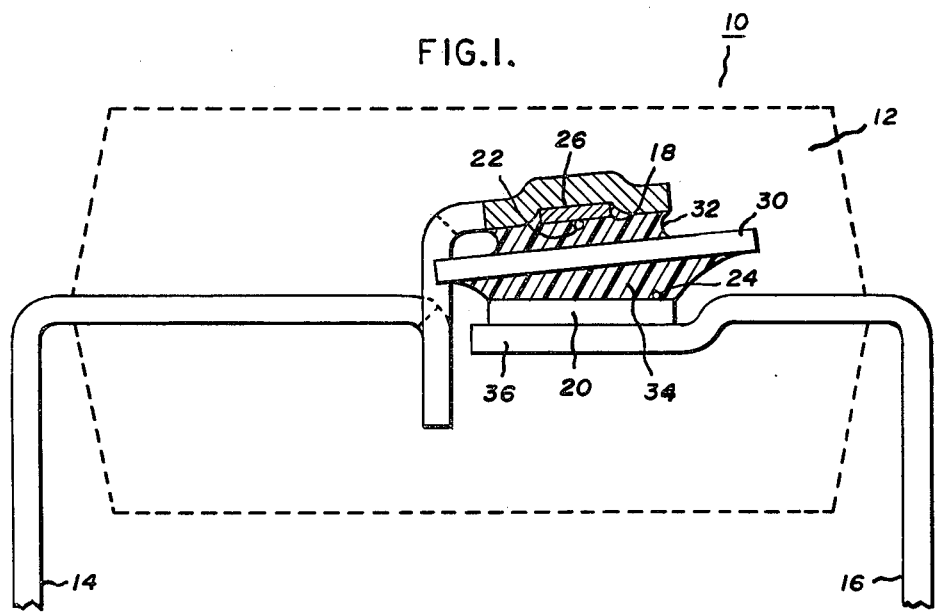

United States Patent [19]

Aird

[11] 4,446,375

[45] May 1, 1984

[54] OPTOCOUPLER HAVING FOLDED LEAD FRAME CONSTRUCTION

[75] Inventor: Alanson D. Aird, No. Syracuse, N.Y.

[73] Assignee: General Electric Company, Syracuse, N.Y.

[21] Appl. No.: 311,308

[22] Filed: Oct. 14, 1981

[51] Int. Cl.³ .............................................. G02B 27/00
[52] U.S. Cl. ........................................ 250/551; 357/19
[58] Field of Search ........................ 250/551, 552, 239; 357/19

[56] References Cited

U.S. PATENT DOCUMENTS 3,893,158  7/1975  Lincoln .............................. 357/19 X
4,047,045  9/1977  Paxton, Jr. et al. ................. 250/551
4,160,308  7/1979  Courtney et al. ............... 250/551 X
4,322,628  3/1982  Tanaka ................................ 250/551

FOREIGN PATENT DOCUMENTS 140820  3/1980  Fed. Rep. of Germany ........ 357/19

Primary Examiner—Edward P. Westin
Attorney, Agent, or Firm—R. J. Mooney

[57] ABSTRACT

Optocoupler having lead frame with semiconductor pellet mounting portions constructed and arranged to facilitate low cost mechanized pellet mounting, and subsequent simplified orientation of pellets in efficient radiation-coupling relation.

10 Claims, 5 Drawing Figures

OPTOCOUPLER HAVING FOLDED LEAD FRAME CONSTRUCTION

This invention relates to semiconductor optocouplers, and more particularly to a mounting construction in such couplers which employs a one-piece lead frame as a mounting for both the emitter and detector elements of the coupler and is particularly suitable for mechanized assembly.

Semiconductor optocouplers normally include an emitter element, a detector element and an optically transmissive element or medium between the emitter and detector elements, which medium possesses sufficient dielectric strength to provide electrical isolation of the emitter and detector elements of at least several thousand volts while efficiently coupling, i.e. allowing the passage of, radiation from the emitter to the detector. The operation of such a coupler is known, but it has been a problem to provide all of the elements in a form which is easy to manufacture and which is preferably manufacturable using automatic equipment rather than hand assembly. Further, the coupler must be capable of withstanding high emitter-to-detector voltages without breaking down between the emitter and detector, while at the same time providing efficient coupling of radiation from the emitter to the detector. Consequently a number of competing considerations are encountered in the design of such couplers. For example while increased isolation voltage may be easily obtained by increasing the spaces between the emitter and detector pellets, increased spacing produces increased path losses between the optocoupler elements thus reducing the efficiency of coupling. Certain materials, such as glass, combine high light transmissivity with high dielectric strength and are therefore preferred as a coupling medium between emitter and detector elements in optocouplers.

In prior art couplers, glass has been used to some advantage by, for example, forming a metal pattern on one surface of a glass plate and bonding the emitter pellet to the patterned metal for making electrical contact to the pellet while at the same time allowing radiation emitted from the emitter pellet to be transmitted through the glass. The combination of the glass and the emitter would then be positioned on the detector pellet and adhered thereto by an optically transmissive adhesive layer, such as a silicone resin or clear epoxy or the like. Electrical connection to the emitter and detector pellets was made by leads from the pellets or from a metalized pattern on the glass to a flat lead frame which included several pins for attaching the device in an electrical circuit.

While prior art optocouplers as described have been built with satisfactory operating characteristics, especially in respect to efficiency of coupling and dielectric strength, nevertheless such a construction requires certain assembly steps which are not readily carried out by automated equipment and which must therefore be performed by manual operations. This greatly increases the cost of manufacture of such a coupler and therefore detracts from its utility. While advances are being made in the ability of automatic assembly equipment to perform operations which have heretofore been accomplished by hand, nevertheless certain limitations still remain. While it is relatively easy to accurately position a single pellet, whether emitter or detector, on a lead frame, it is much more difficult to achieve the necessarily accurate alignment required between emitter and detector pellets.

Such accurate alignment of emitter to detector is essential in the heretofore described glass-dielectric coupler and this is the reason why such a coupler, although desirable from a performance point of view, has been difficult to manufacture at the low cost required for widespread acceptance.

A second form of prior art coupler is described, for example, in U.S. Pat. No. 4,179,619 wherein emitter and detector pellets are disposed on separated elements of an originally unitary, but subsequently divided, lead frame, and the coupling between emitter and detector is through a dielectric medium which bridges the space between the emitter and detector elements. Such a construction is suitable for assembly by automatic means with attendant reduced costs, but it has been found that the coupling efficiency of such a construction is somewhat lower than has been achieved by hereinabove described coupler using a glass dielectric medium.

It is an object of this invention to provide an optocoupler which combines the advantages of high dielectric strength and high transmissivity between the emitter and detector elements thereof, previously obtainable only with difficult-to-manufacture glass dielectric couplers, with the low cost and compatibility with automatic assembly of couplers wherein the emitter and detector pellets are directly mounted on a single lead frame in automatic registration of the emitter and detector with respect to each other.

Briefly stated, the present invention attains these objects by providing an optocoupler having an initially unitary or single lead frame element, to a common major face of which both emitter and detector elements are readily attached, preferably by automatic means, and in precisely located sites on the lead frame. A glass medium or transmission element is disposed in surmounting relation with the detector pellet and secured thereto by a layer of a curable, dielectric, emission transmissible medium such as a clear silicone resin. The location of the glass element with respect to the detector pellet is relatively non-critical, simplifying its placement by automatic means. With the emitter element, detector element and glass transmission element thus automatically mounted, all that remains is to bring the emitter into precise automatic radiation coupled registry with the detector, a step which is achieved simply by bending or folding the emitter carrying portion of the lead frame into confronting relation with the detector pellet, with the glass dielectric medium disposed therebetween. The emitter element is preferably secured to the opposite surface of the glass medium by a second layer of a clear curable dielectric material, such as a silicone resin. The coupler described has the unique advantage that all of the components with respect to which precise alignment is required are mounted on an initially unitary and rigid lead frame. In this way accurate registration can be obtained while permitting automatic mountdown of both the emitter and detector elements. The glass transmission element or medium is non-critically located with respect to the emitter and detector pellets and may be made somewhat oversized to even further reduce the criticality of locating the glass element. In this way the glass element may also be automatically mounted by an assembly machine.

Features of the invention which are believed to be novel are pointed out with particularity in the appended claims. The invention itself however, both as to its organization and method of operation together with further objects and advantages thereof may best be understood by reference to the following description taken in conjunction with the accompanying drawing in which:

FIG. 1 is an enlarged section view of a completed optocoupler constructed in accordance with this invention.

FIGS. 2 through 5 are perspective views, diminished in scale relative to FIG. 1, of a lead frame portion of an optocoupler constructed according to the present invention, showing in sequence the attachment of the emitter and detector pellets thereto and further showing the steps of folding the requisite portion of the lead frame so as to bring the emitter and detector pellets into alignment and registry and dispose the glass dielectric medium therebetween.

Referring now to FIG. 1, the internal arrangement of significant parts of an optocoupler constructed in accordance with the present invention may be seen. The optocoupler indicated generally at 10 is enclosed within an encapsulant 12 preferably of opaque dielectric material such as epoxy or silicone resin or any other suitable meaterial possessing the desired dielectric strength, rigidity, hermeticity and opaqueness. Such housings per se are well-known in the art and as such form no particular part of this invention except in combination with the other elements thereof. Electrical connection is made to the elements of the optocoupler by pins, two of which are shown at 14 and 16, which extend from opposite sides of encapsulant 12. Typically, several pins are employed on each side of encapsulant 12 constituting the dual in-line package (DIP) configuration known in the art. The embodiment chosen to illustrate this invention has six pins of which not all need be active and three extend from each side of encapsulant 12. These pins are more clearly visible in FIGS. 2 through 5. The emitter element 18 and detector element 20 each have two or more electrical connections made thereto and it is preferred that all of the emitter connections be brought to one side of encapsulant 12 while all of the detector connections be brought to the other side for maximizing the spacing therebetween and increasing the physical isolation and therefore the dielectric strength between the emitter input and the detector output.

One electrical contact may be made to each of emitter 18 and detector 20 through the lead upon which the emitter or detector is mounted. For example, emitter 18 may conveniently be a P-N semiconductor diode, one layer of which is directly bonded to lead 14 as indicated in FIG. 1, while connection to the other layer is conveniently made through wire lead 22 which is shown in cross-section in the Figure and which is bonded at the other end thereof to one of the other pins 52 of the lead frame as may be seen in FIGS. 3, 4 and 5. Similarly, detector 20 may be a photo transistor and may have, for example, the collector thereof directly bonded to lead 16 with another active portion thereof connected to one of the other leads 54 by wire 24.

It is a feature of this invention that emitter pellet 18 may be mounted in a recess 26 in lead 14 to provide enhanced direction of the emitted radiation, toward the detector pellet. Cup-shaped recess 26 may take a number of particular forms in order to maximize the amount of radiation actually directed toward detector 20. Emitter 18 may be bonded within recess 26 by a number of methods, such as by soldering or the like.

The efficiency of coupling between emitter 18 and detector 20 is enhanced while the electrical isolation therebetween is increased through the inclusion of glass dielectric transmission member 30 therebetween. While glass is preferred in accordance with the present embodiment of the invention, other materials transmissive to the radiation emitted from emitter 18 and having high dielectric strength may be readily substituted for the glass of member 30 as will be appreciated by those skilled in the art. Coupling between the emitter and detector pellets respectively and glass layer 30 is improved by including intermediate coupling layers 32 and 34 therebetween which layers are each preferably a curable transparent dielectric material such as silicone resin, epoxy, or the like. It is preferred in accordance with this invention that glass element 30 be somewhat larger than detector pellet 20 which is itself typically larger than emitter pellet 18 so that alignment of glass element 30 is particularly noncritical and therefore more readily placed by automatic means. It is further preferred that glass element 30 overlap detector pellet 20 on all sides thereby greatly increasing the dielectric strength of coupler 10 between emitter 18 and detector 20. A preferred method for assembling optocoupler 10 will be discussed hereinbelow in connection with FIGS. 2 through 5.

It will be observed that the portion of lead 14 which contains recess 26 and pellet 18 mounted therein is disposed not parallel but at a slight angle with respect to the portion of lead 16 to which detector pellet 20 is mounted. It has been determined that assembly according to the invention is facilitated by allowing such a slight angle to exist between the emitter and detector pellets. It should be recognized that this angle is not required by the invention and that parallel disposition is acceptable.

Lead 16, especially at inboard end portion 36 thereof, is preferably depressed somewhat, as best shown in FIG. 1, so as to center the emitter-detector assembly vertically within the body of encapsulant 12.

Figure 2:
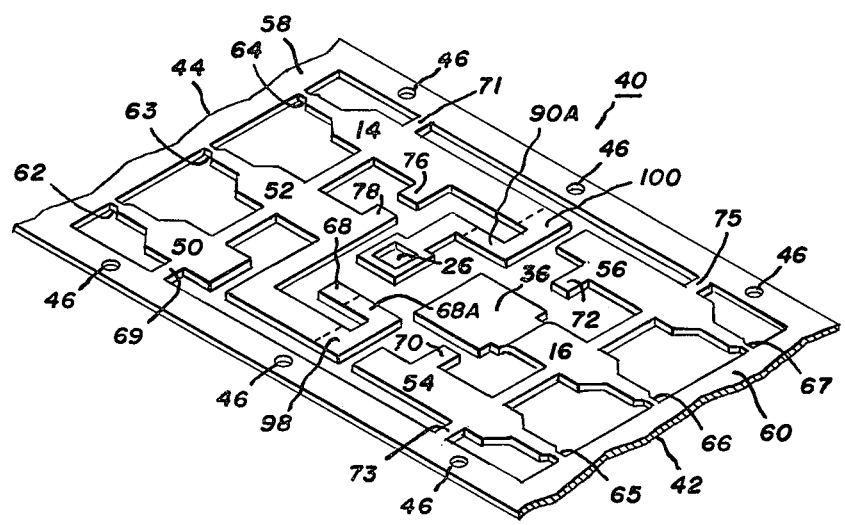

The assembly of an optocoupler in accordance with this invention may be more clearly understood by referring now to FIGS. 2 through 5. A lead frame 40 in accordance with this invention is shown in FIG. 2 in a condition prior to the mounting of emitter or detector pellets thereon and further prior to any bending or folding thereof. The lead frame 40 is a thin filigree plate, having two pellet receiving areas on one major face, namely emitter receiving recess 26 and detector receiving platform 36 as heretofore described in connection with FIG. 1. As has been discussed, recess 26 is preferably slightly larger than the emitter pellet to be disposed therein and has curved or otherwise contoured sides for ultimately maximizing the reflection of emitted radiation in the direction of the surface of detector pellet 20. Platform 36 of lead 16 is preferably displaced downward somewhat from the remainder of lead 16 in order to locate the pellet assembly more toward the center of body 12 as shown in FIG. 1.

In accordance with a presently preferred embodiment of the invention, lead frame 40 of FIG. 2 is preferably a segment of an extended strip of such lead frames which are attached at ends 42 and 44. This construction allows the simultaneous molding of encapsulant body 12 in a number of such lead frames while facilitating automatic mounting of emitter and detector pellets thereto. Holes 46 at the periphery of lead frame 40 are adapted to receive locating pins for accurate registration of the lead frame with automatic pellet mounting equipment. In addition to pins 14 and 16, lead frame 40 includes further pins 50, 52, 54 and 56 as shown. These pins are connected to first and second perimeter portions 58 and 60 of lead frame 40 by severable connecting portions 62 through 67 and 69, 71, 73 and 75. Further the leads are attached to their neighbors by removable members 77, 79, 81 and 83, as best shown in FIG. 4. As best shown in FIG. 2, pins 52, 54 and 56 are provided with lead receiving portions 68, 70 and 72, to which wire leads are attached as will be described hereinbelow. Further, as best shown in FIG. 2, several pins are provided with strengthening members such as member 76 which extends from pin 14 and member 78 which extends from pin 52. These members 76 and 78, when encased within encapsulant body 12, add strength to the body-pin interface. While many materials for forming lead frames in accordance with the prior art have been known, and while the requirements for the lead frame in accordance with this invention are not particularly different, nevertheless it has been found that a particularly advantageous lead frame may be manufactured from a metallic material which is easily stamped and formed to provide the various elements of the invention and which may be silver plated to facilitate attachment of the emitter and detector pellets thereto as well as to provide a surface advantageous for automatic wire bonding as will be shown in connection with FIG. 3.

Figure 3:
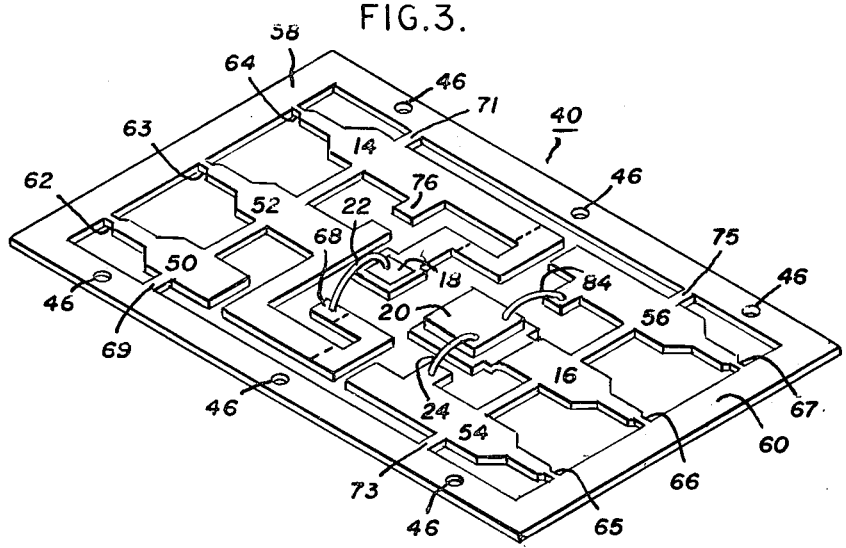
Figure 4:
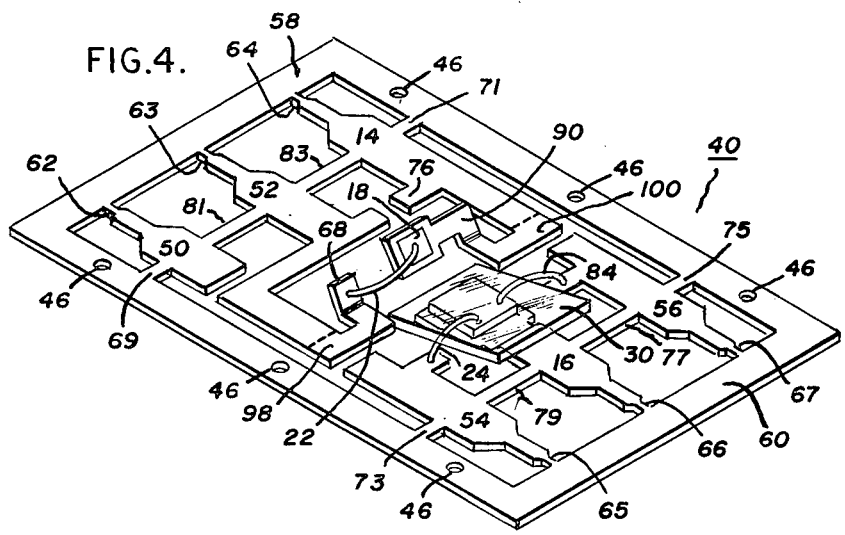

Referring now to FIG. 3 and particularly the placement of emitter pellet 18 and detector pellet 20 on leads 14 and 16 respectively, as has been hereinabove described the structure of this invention is particularly well suited to automatic assembly wherein the pellets are picked from a storage container such as a membrane, the output of a shaker feed device, or the like and automatically aligned with and mounted on the respective mounting areas. The mountdown of the emitter pellet in recess 26 may be accomplished by any suitable metallization known in the art. The detector pellet may similarly be mounted using any suitable metallization system known in the art, or in the alternative, a low temperature bonding structure may be employed such as silver epoxy which does not require heating the lead frame or the pellet to accomplish mountdown. After the pellets are mounted to the common upwardly facing major face of the lead frame, bonding of the wires 22, 24, and 84 which connect the pellets to the other terminals of the lead frame may be carried out. This invention is particularly well suited to automatic or semiautomatic wire bonding wherein the lead frame is accurately positioned in the bonding machine and wire leads 22, 24 and 84 are installed as illustrated in FIG. 3. Lead 22 connects the upper electrode of emitter pellet 18 to bonding area 68 of pin 52. While any type of conventionally used wire which is known by those skilled in the art to be suitable for wire bonding applications may be employed in accordance with this invention, it has been found that gold wire offers certain advantages as to performance and reliability which make it preferable in this application. Detector pellet 20 is connected by wire leads 24 and 84 to lead receiving areas 70 and 72 respectively of pins 54 and 56.

Next a small amount of clear silicone resin 34 or other curable dielectric material is applied to the upper surface of the detector pellet 20 to facilitate attaching glass plate 30 to the upper surface of detector pellet 20. This resin 34 also provides some support for leads 24 and 84.

After the application of resin 34 to the detector pellet 20, glass plate 30 is positioned thereon preferably using the same type of automatic equipment which may be beneficially employed for mounting the emitter and detector pellets themselves. After plate 30 is positioned it is preferred to partially cure the coupling layer 34 to provide somewhat firmer attachment of plate 30 during subsequent operations so that it will not move about. Coupling material 32 is thereafter applied to the top surface of emitter 18.

As best illustrated in FIG. 4, lead receiving portion 68 of terminal 52 and end 90 of terminal 14 are bent to a nearly vertical position. It will be evident from FIGS. 2 and 4 that portions 68 and 90 constitute the inner ends of reentrant arms 68A and 90A, which extend respectively from the inboard ends 98 and 100 of pins 52 and 14, thereby facilitating the folding of portions 68 and 90 without disturbing the remainder of pins 52 and 14. It has been found that it is difficult to create a precisely 90° angle between lead receiving portion 68, end portion 90 and the plane of lead frame 40. This is due in part to the resiliency of the metal lead frame material and is advantageously accommodated in accordance with this invention by the non-parallel fashion in which plate 30 is disposed on the upper surface of detector 20. The angle of plate 30 is advantageous since it allows for greater clearance between plate 30 and pellet 20 for leads 24 and 84 which attach to pellet 20.

The fold or bend shown in FIG. 4 may be quite readily accomplished in accordance with this invention by automatic equipment having camming fingers (not shown) which project up from the plane of the lead frame to cause the bend. Since a bend as shown in FIG. 4 of somewhat less than 90° is sufficient, a complicated bending apparatus, such as a brake or the like, is not required and the bend may be easily formed with simple reliable inexpensive equipment.

Figure 5:
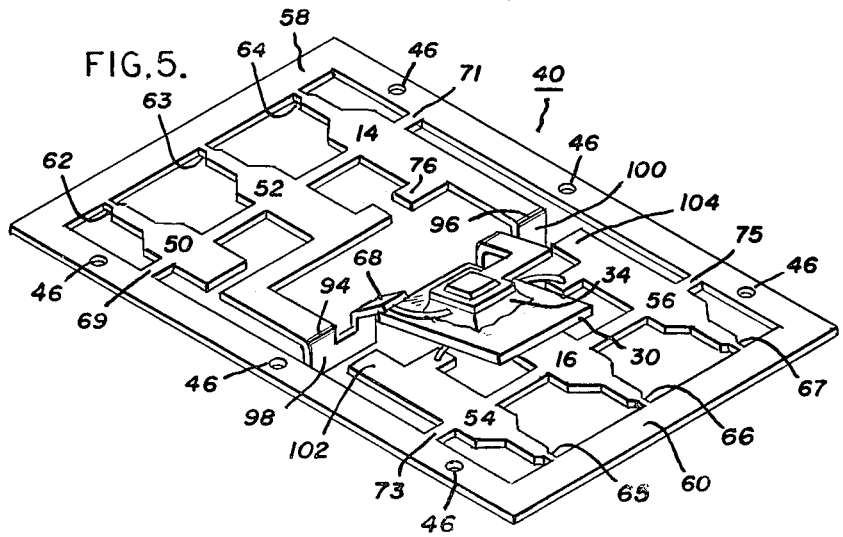

An additional fold or bend is performed as illustrated in FIG. 5. This bend is formed by bending the inboard ends 98 and 100 of pins 14 and 52 downward along lines 96 and 94 respectively, thereby bringing emitter pellet 18 into alignment over detector pellet 20 through plate 30. Optical coupling between emitter pellet 18 and plate 30 is enhanced by dielectric coupling layer 32 which contacts plate 30 and spreads out somewhat to form a thin layer as shown. It is preferred in accordance with this invention that after the final bend of FIG. 5, pellet receiving portion 90 of lead 14 lies in a plane substantially parallel to the plane of glass plate 30. At the same time that emitter pellet 18 is swung over into confronting alignment with detector pellet 20 by the final bend, inboard end portions 98 and 100 of leads 52 and 14 respectively are swung down and separated from portions 102 and 104 of leads 54 and 56 respectively, thereby increasing the spacing therebetween and greatly enhancing the dielectric strength and breakdown voltage of the device.

After the final bend has been made as illustrated in FIG. 5, the assembly is then heated to an elevated temperature to completely cure coupling layers 32 and 34 and to permanently anchor the various elements of the coupler together. The curing time and temperatures are a particular function of the materials selected for layers 32 and 34 and well-known to those skilled in the art. After the curing has been completed the devices may be encapsulated, for example by placing the lead frame in a transfer molding press and molding encapsulant body 12 in accordance with well-known techniques. Thereafter, portions 77, 79, 81 and 83, as well as 69, 71, 73 and 75, are removed; and several portions 62 through 67 are severed to release the completed optocoupler from the lead frame peripheral portions, and pins 14, 16 and 50, 52, 54, 56 may be oriented as shown in FIG. 1, to complete the fabrication process.

Thus there has been shown and described an optocoupler having a construction which lends itself to easy placing and mounting of emitter and detector pellets on a common major face of an initially one piece filigree lead frame, whose emitter and detector are brought into operational registry by simply folding or bending a portion of the lead frame, and which has the advantages of high dielectric isolation between emitter portion and detector.

What is claimed is:

1. A lead frame for an optocoupler comprising:
   a one-piece longitudinally extending substantially planar strip of metallic material having a severable marginal portion surrounding a filigreed portion providing spaced respective bonding sites on a common major face of said strip, said bonding sites being adapted to receive respectively an emitter element and a detector element,
   one of said bonding sites being situated on the end portion of an extended finger formed in said filigreed portion,
   said extended finger being shaped and arranged relative to the other bonding site such that by bending said extended finger intermediate its ends said one bonding site can be positioned in a second plane at least approximately parallel to the plane of said lead frame and spaced therefrom, whereby the pair of bonding sites is placed in substantially confronting, proximately spaced relationship;
   said lead frame further comprising additional fingers having end portions which provide respective additional bonding sites for leads associated with said emitter and detector elements, at least one of said additional fingers being shaped and positioned relative to said extended finger such that its additional bonding site can be placed approximately into said second plane, without changing the wiring distance between the bonding site on said extended finger and the bonding site on said additional finger, by bending said additional finger intermediate its ends simultaneously with the bending of said extended finger.

2. A lead frame as defined in claim 1 wherein;
   said extended finger is adapted to be bent in a plurality of locations and has a reentrant portion including at least one of said locations.

3. A lead frame as defined in claim 2 wherein;
   said at least one additional finger has a reentrant portion generally parallel to said reentrant portion of said extended finger, said reentrant portions being adapted to be bent about the same axis.

4. A lead frame as defined in claim 1 wherein said bonding site on the end portion of said extended finger is located at the bottom of a cup-shaped recess in said extended finger to accept said emitter element, and wherein the interior side walls of said recess provide a surface for maximizing the radiation emitted by the emitter element and reflected toward said detector element.

5. An optocoupler comprising:
   a plurality of fingers of thin metallic sheet material having outer portions and substantially coplanar middle portions,
   said fingers further having inner end portions providing spaced respective bonding sites on which are mounted respectively an emitter element and a detector element,
   the emitter-carrying finger being bent approximately 180° relative to the bonding site of the detector-carrying finger such that said emitter element lies in a second plane at least approximately parallel to the plane defined by said middle portions and spaced therefrom and said emitter and detector elements are arranged in substantially confronting, proximately spaced relationship,
   said opto-coupler further comprising a plurality of additional fingers providing respective additional bonding sites thereon, said additional sites having leads bonded thereto associated with said emitter and detector elements, at least one of said additional fingers being bent approximately 180° in the same direction as said emitter-carrying finger such that its bonding site lies approximately in said second plane.

6. An optocoupler as defined in claim 5 wherein;
   the middle and inner end portions of said fingers and said emitter and detector element are all enclosed within a body of encapsulant,
   and the outer portions of said fingers protrude from said body of encapsulant to constitute external connectors for portions of emitter and detector elements.

7. An optocoupler as defined in claim 5 wherein;
   a transmission member comprising an optically transparent medium possessing high dielectric strength is situated between said confronting emitter element and detector element and is secured therebetween by transmissive, insulative, resinous material.

8. An optocoupler as defined in claim 5 wherein said bonding site containing said emitter element is located at the bottom of a cup-shaped recess in said emitter-carrying finger and wherein the interior side walls of said recess provide a surface for maximizing the radiation emitted by the emitter element and reflected toward said detector element.

9. An optocoupler as recited in claim 5 wherein the 180° bend of each of said bent fingers includes first and second bends of approximately 90° each.

10. An optocoupler as recited in claim 9 wherein each pair of first bends is bent substantially 90° around a common first axis and each pair of second bends is bent substantially 90° around a common second axis, said first and second axes being parallel to each other.

* * * * *